(12) United States Patent
Koseki et al.

(10) Patent No.: US 11,976,350 B2
(45) Date of Patent: May 7, 2024

(54) COVERING MEMBER AND METHOD FOR MANUFACTURING THE SAME

(71) Applicant: Proterial, Ltd., Tokyo (JP)

(72) Inventors: Shuho Koseki, Tokyo (JP); Daiki Shinno, Tokyo (JP)

(73) Assignee: Proterial, Ltd., Tokyo (JP)

( * ) Notice: Subject to any disclaimer, the term of this patent is extended or adjusted under 35 U.S.C. 154(b) by 930 days.

(21) Appl. No.: 16/971,688

(22) PCT Filed: Feb. 15, 2019

(86) PCT No.: PCT/JP2019/005573
§ 371 (c)(1),
(2) Date: Aug. 21, 2020

(87) PCT Pub. No.: WO2019/167674
PCT Pub. Date: Sep. 6, 2019

(65) Prior Publication Data
US 2020/0407837 A1    Dec. 31, 2020

(30) Foreign Application Priority Data

Feb. 27, 2018   (JP) .................................. 2018-032834

(51) Int. Cl.
*C23C 14/06*   (2006.01)
*C23C 14/58*   (2006.01)

(52) U.S. Cl.
CPC ...... *C23C 14/0641* (2013.01); *C23C 14/5873* (2013.01)

(58) Field of Classification Search
None
See application file for complete search history.

(56) References Cited

U.S. PATENT DOCUMENTS

| 5,643,658 | A | * | 7/1997 | Uchino | C23C 30/005 428/467 |
| 2002/0102400 | A1 | | 8/2002 | Gorokhovsky et al. | |
| 2017/0009331 | A1 | | 1/2017 | Lyo et al. | |

FOREIGN PATENT DOCUMENTS

| JP | 2000256878 | 9/2000 |
| JP | 2009078351 | 4/2009 |
| KR | 20120129445 | 11/2012 |

(Continued)

OTHER PUBLICATIONS

"Search Report of Europe Counterpart Application", dated Nov. 4, 2021, p. 1-p. 7.

(Continued)

*Primary Examiner* — Jeffrey D Washville
(74) *Attorney, Agent, or Firm* — JCIPRNET

(57) ABSTRACT

A covering member has a hard film on the surface of a base material, wherein the hard film comprises a layer A selected from a nitride, a carbonitride, an oxynitride, and an oxycarbonitride of Cr or CrM; a metal layer which is formed on the outer surface side of the A layer and includes Cr, Ti, or W; and a layer B which is formed on the outer surface side of the metal layer and selected from a nitride, a carbonitride, an oxynitride, and an oxycarbonitride of Cr or CrM, and wherein M is one or two or more from a Group 4 metal, a Group 5 metal, a Group 6 metal of the periodic table, Al, Si, and B, and strain is introduced in the outer surface side of the metal layer.

8 Claims, 5 Drawing Sheets

(56) References Cited

FOREIGN PATENT DOCUMENTS

| WO | 2009119269 | 10/2009 |
|---|---|---|
| WO | 2011125657 | 10/2011 |
| WO | 2016027832 | 2/2016 |

OTHER PUBLICATIONS

"International Search Report (Form PCT/ISA/210) of PCT/JP2019/005573", dated May 7, 2019, with English translation thereof, pp. 1-2.

"Office Action of Europe Counterpart Application", dated May 3, 2023, p. 1-p. 4.

* cited by examiner 1 mm 1 mm

COVERING MEMBER AND METHOD FOR MANUFACTURING THE SAME

CROSS-REFERENCE TO RELATED APPLICATION

This application is a 371 of international application of PCT application serial no. PCT/JP2019/005573, filed on Feb. 15, 2019, which claims the priority benefit of Japan application no. 2018-032834, filed on Feb. 27, 2018. The entirety of each of the above-mentioned patent applications is hereby incorporated by reference herein and made a part of this specification.

TECHNICAL FIELD

The present invention relates to a covering member and a method for manufacturing the same.

BACKGROUND ART

In the related art, in procedures of manufacturing injection molded parts such as a screw and a seal ring using plastic, a resin, rubber, or the like, excellent corrosion resistance has been required for a mold used for injection molding due to a corrosive environment caused by a material to be molded. Various additives are added to the injection molded part in order to improve heat resistance and strength, and during injection molding, the plastic decomposes due to its heating or heat generation, and a corrosion gas is also generated from the above additive, and a mold for injection molding is exposed to a severe corrosive environment, which causes pitting corrosion, gas seizure, and the like.

On the other hand, in die casting molds used for manufacturing components for automobiles, precision instruments, home electric appliances, and the like, there is a problem of a melting phenomenon in which a molten metal comes in contact with a mold and the part melts. In addition, the surface of the die casting mold is repeatedly subjected to heating by the molten metal and cooling by spraying a release agent, and therefore fatigue cracks due to thermal stress may occur.

In the related art, there have been various studies in order to improve corrosion resistance of a mold for injection molding and melting resistance of a die casting mold. For example, in Patent Literature 1, a method for manufacturing a coated object in which the surface of a base material of an object is covered with a hard film composed of at least two or more layers by a physical vapor deposition method is described. This manufacturing method is a method for manufacturing a coated object including a step of covering a surface of the base material with a first hard film, and a step of covering a surface of the first hard film with a second hard film, and further including a step of polishing the surface of the first hard film so that it has an arithmetic average roughness Ra of 0.05 μm or less and a maximum height Rz of 1.00 μm or less before the step of covering with the second hard film. In addition, Patent Literature 2 discloses a cutting tool with a coating for reducing an amount of macro particles inside a film and on a surface of the film and reducing amounts of holes, voids, and pores of the film. That is, the cutting tool with a coating described in Patent Literature 2 is a cutting tool with a coating in which, in a method for manufacturing a cutting tool with a coating including a step of depositing a film on a base material by a cathodic arc evaporation PVD deposition method, the film is made of a nitride, an oxide, a boride, a carbide, a carbonitride, an oxycarbonitride or a combination thereof, and in the deposition step, the film is subjected to separate intermediate ion etching one or more times. In addition, in Patent Literature 3, a method for manufacturing a die cast coated mold including a step of covering a surface of a base material of a die casting mold with a first hard film by an arc ion plating method, a step of smoothing a surface of the first hard film, and a step of applying a second hard film to the smoothed first hard film by an arc ion plating method in order to improve melting resistance and seizure resistance with respect to a molten metal is disclosed.

CITATION LIST

Patent Literature

[Patent Literature 1]
WO 2011/125657
[Patent Literature 2]
Japanese Patent Laid-Open No. 2009-78351
[Patent Literature 3]
WO 2016/027832

SUMMARY OF INVENTION

Technical Problem

The above technologies of Patent Literatures 1 to 3 are very effective inventions that can reduce the amount of droplets on a hard film, decrease a pitting corrosion starting point, and improve corrosion resistance (melting resistance). However, as described in Patent Literatures 1 to 3, even if the surface of the hard film before lamination is polished, it is not possible to suppress the occurrence of intergranular corrosion that progresses using crystal grain boundaries as a corrosion path, and the corrosion path enlarges due to the progress of intergranular corrosion, which may cause defects that penetrate to the base material. A method for preventing the occurrence of the intergranular corrosion and suppressing the growth of intergranular corrosion is not described in Patent Literatures 1 to 3 and there is room for consideration. Therefore, an objective of the present invention is to provide a covering member that can suppress the occurrence of intergranular corrosion that progresses using crystal grain boundaries as a corrosion path and suppress the occurrence of pitting corrosion caused by droplets and the like present at an interface, and a method for manufacturing the same.

Solution to Problem

The present invention has been made in view of the above circumstances.

Specifically, an aspect of the present invention is a covering member having a hard film on a surface of a base material, wherein the hard film includes a layer A is selected from among a nitride, a carbonitride, an oxynitride, and an oxycarbonitride of Cr or CrM (M is one or two or more selected from among Group 4 metals, Group 5 metals, and Group 6 metals on the periodic table, Al, Si, and B), a metal layer which is formed on an outer surface side of the layer A and contains Cr, Ti, or W, and a layer B which is formed on the outer surface side of the metal layer and is selected from among a nitride, a carbonitride, an oxynitride, and an oxycarbonitride of Cr or CrM (M is one or two or more selected from among Group 4 metals, Group 5 metals, and Group 6 metals on the periodic table, Al, Si, and B), and wherein strain is introduced into the outer surface side of the metal layer.

Preferably, a second metal layer containing Cr, Ti, or W is provided on the outer surface side of the layer B.

Preferably, the thickness of at least one of the layer A and the layer B is 4 to 20 μm.

Preferably, the thickness of at least one of the layer A and the layer B is 6 μm or more.

Another aspect of the present invention is to provide a method for manufacturing a covering member having a hard film on a surface of a base material, including a first coating step in which a base material is coated with a layer A selected from among a nitride, a carbonitride, an oxynitride, and an oxycarbonitride of Cr or CrM (M is one or two or more selected from among Group 4 metals, Group 5 metals, and Group 6 metals on the periodic table, Al, Si, and B), a metal layer coating step in which a metal layer containing Cr, Ti, or W is coated after the layer A is coated, a metal layer modifying step in which strain is introduced into a surface layer of the metal layer after the metal layer is coated, and a second coating step in which a layer selected from among a nitride, a carbonitride, an oxynitride, and an oxycarbonitride of Cr or CrM (M is one or two or more selected from among Group 4 metals, Group 5 metals, and Group 6 metals on the periodic table, Al, Si, and B) is coated after the metal layer modifying step.

Preferably, the metal layer modifying step is metal ion bombardment using Cr ions or Ti ions.

Preferably, a polishing step of polishing a surface of the layer A is performed between the first coating step and the metal layer coating step.

Preferably, a second metal layer coating step in which a second metal layer containing Cr, Ti or W is coated is provided after the second coating step.

Advantageous Effects of Invention

According to the present invention, it is possible to obtain a covering member that can suppress the occurrence of pitting corrosion and the occurrence of intergranular corrosion caused by droplets.

DESCRIPTION OF EMBODIMENTS

Figure 1:
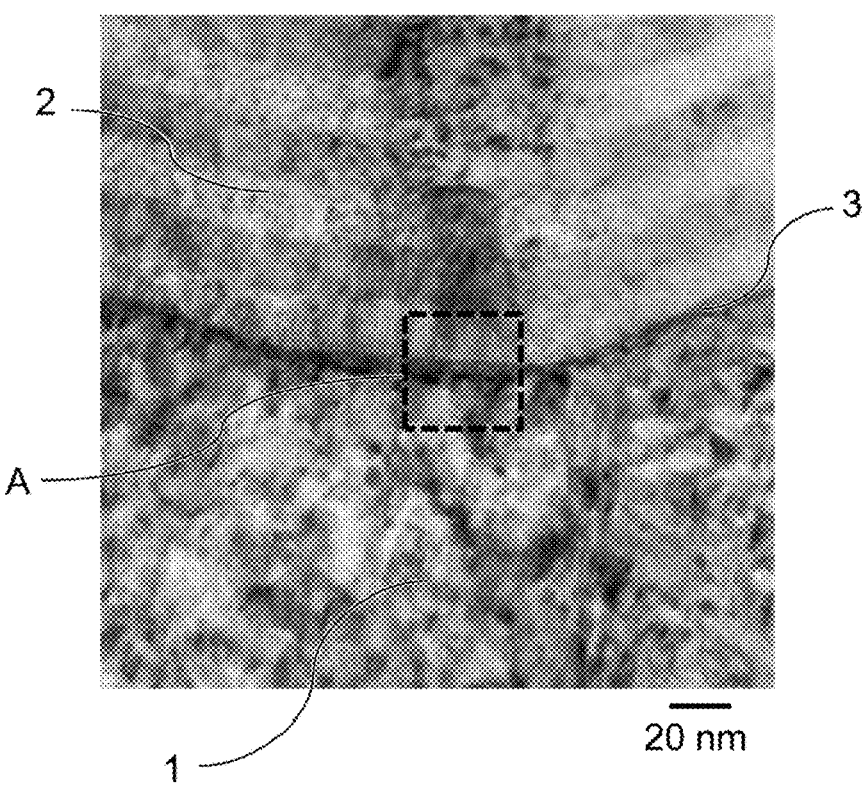
FIG. 1 is a TEM image of a cross section of a covering member of the present invention.

Hereinafter, embodiments of the present invention will be described in detail. However, the present invention is not limited to the embodiments exemplified here, and appropriate combinations and improvements are possible without departing from the technical idea of the invention. A covering member of the present invention can be applied to various mechanical components, molds, and tools. Preferably, it is applied to a mold for injection molding which is exposed to a corrosive environment and for which high corrosion resistance is required and a die casting mold that is likely to melt due to contact with a molten metal.

First, a covering member of an embodiment of the present invention will be described. The covering member of the present embodiment has a hard film on a surface of a base material of a member. The hard film includes a layer A selected from among a nitride, a carbonitride, an oxynitride, and an oxycarbonitride of Cr or CrM (M is one or two or more selected from among Group 4 metals, Group 5 metals, and Group 6 metals on the periodic table, Al, Si, and B), a metal layer which is formed on the outer surface side of the layer A, and contains Cr, Ti or W, a layer B which is formed on the outer surface side of the metal layer and is selected from among a nitride, a carbonitride, an oxynitride, and an oxycarbonitride of Cr or CrM (M is one or two or more selected from among Group 4 metals, Group 5 metals, and Group 6 metals on the periodic table, Al, Si, and B), and strain is introduced into the outer surface side of the metal layer.

In the covering member of the present embodiment, in order to further improve adhesion with respect to a base material, the layer A is selected from among a nitride, a carbonitride, an oxynitride, and an oxycarbonitride of Cr or CrM (M is one or two or more selected from among Group 4 metals, Group 5 metals, and Group 6 metals on the periodic table, Al, Si, and B). When a total content of metal components contained in the layer A is set as 100 atom %, the content of Cr in the layer A is preferably 25 atom % or more, and more preferably, the layer A is made of a nitride. In addition, M is preferably selected from among Al, Si, and B, which has an effect of making the structure finer and improving wear resistance. When a total content of metal components contained in the layer A is set as 100 atom %, the content of M is preferably 5 atom % or more.

The thickness of the layer A in the present embodiment is preferably adjusted to 4 to 20 μm. Therefore, when corrosion progresses from the side of the surface of the film, since it is possible to lengthen a path before corrosion reaches a substrate, it is possible to obtain a member having a longer lifespan. In addition, if defects having a size of 1 to 2 μm are generated in the film due to droplets present in the film, when such coarse defects continuously overlap in the thickness direction, they may cause a penetration defect. Therefore, the lower limit of the film thickness is set to 4 μm or more, and the layer A is formed to have a certain thickness, so that it is possible to suppress continuous overlapping of droplets in the thickness direction of the film. While the layer A is too thick, since the entire film thickness is too thick, desired properties may not be obtained, and while the layer A is too thin, it tends to be difficult to obtain a corrosion resistance improving effect of the film. More preferably, the lower limit of the thickness of the layer A is 5 μm, and still more preferably, the lower limit of the thickness of the layer A is 6 μm. More preferably, the upper limit of the thickness of the layer A can be set to 15 μm.

In the covering member of the present embodiment, a metal layer is formed on the layer A (outer surface side). Here, the metal layer in the present embodiment is a layer which contains 70 at % or more of a metal element, and may partially contain a non-metal element and the like. Here, when the metal layer contains nitrogen as a non-metal element, the content of nitrogen in the metal layer may be reduced by 70 at % or more of the content of nitrogen in the layer A. Preferably, the metal element is 80 at % or more, and more preferably the metal element is 90 at % or more. Thus, regarding the metal element, at least one of Cr, Ti, and W is included. Regarding an element other than Cr, Ti, and W, one or two or more elements selected from among Group 4 metals, Group 5 metals, and Group 6 metals on the periodic table, Al, Si, and B may be included. Preferably, it is selected from among Cr and Ti which are suitable for metal ion bombardment to be described below. More preferably, Cr having excellent corrosion resistance is selected. When Cr is selected, since a Cr target used for the layer A can be continuously used, the productivity is also excellent. When the covering member of the present embodiment includes a metal layer having a different interplanar spacing from the layer A, the continuity between the layer A and the layer B described below can be atomically interrupted. When a defect structure (a structure containing large grain boundaries such as gaps created by droplets or triple points of grain boundaries) serving as a base point of pitting corrosion and intergranular corrosion generated during film formation is formed, a film laminated thereon tends to grow so that it has the same structure form. In the present embodiment, even if a defect structure occurs in the layer A, since the metal layer can prevent the continuity of the defect structure from occurring in the layer B, it is possible to suppress the occurrence of a penetration defect that reaches the base material from the surface of the hard film. The thickness of the metal layer is preferably set to 0.1 to 3.0 μm in order to exhibit the above corrosion suppressing effect more reliably. More preferably, the lower limit of the thickness of the metal layer is 0.2 μm, and more preferably, the upper limit of the thickness of the metal layer is 2.0 μm.

At the interface between the layer A and the metal layer of the covering member of the present embodiment, the number of droplets having a major axis of 1 μm or more that across the interface is preferably 1 or less (including 0) per 50 μm with respect to the length of a direction perpendicular to the film thickness. In the covering member of the present embodiment having this feature, since coarse droplets that are likely to be a starting point of pitting corrosion do not exist at the interface, it is possible to further suppress the occurrence of pitting corrosion. In order to obtain a hard film having a small number of droplets across such an interface, a polishing step for smoothing the surface of the layer A after coating as described in the manufacturing method of the present embodiment to be described below may be introduced. According to this polishing step, it is possible to remove coarse droplets across the interface.

Figure 2:
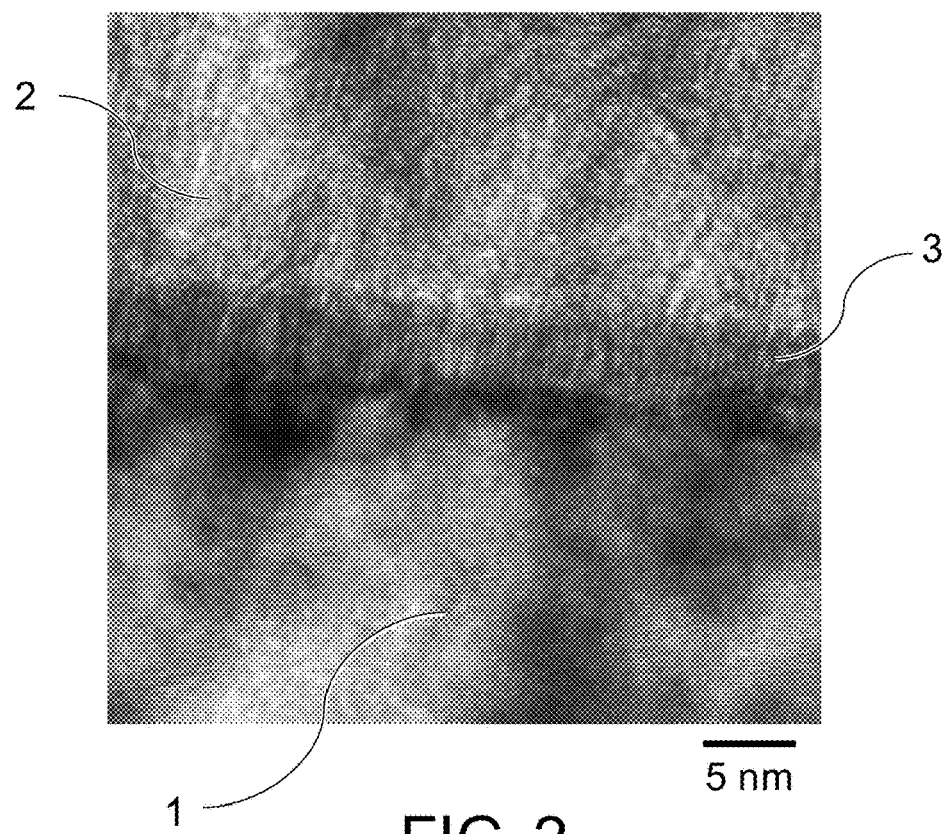
FIG. 2 is a TEM image of an enlarged part A in FIG. 1.

Strain is introduced into the side of the surface layer (the side covered with the layer B to be described below, also referred to as the outer surface side) of the metal layer of the present embodiment. Having an area into which the strain is introduced (hereinafter also referred to as a strained area) is an important feature of the present invention. Since the covering member of the present embodiment has the strained area in which the crystal structure of the metal layer is refined by the introduction of strain, an effect of preventing growth of the defect structure from a lower layer in the metal layer can be significantly improved, and thus it is possible to further improve corrosion resistance of the film. In particular, in the present embodiment, since the metal layer having higher plasticity than the ceramic layer is applied, strain is likely to be introduced and it is possible to easily form a strained area. When the strained area having a thickness of about 1 to 10 nm is formed, it is possible to sufficiently exhibit the above corrosion preventing effect. In addition, in the present embodiment, as will be described below, the surface of the metal layer after coating is subjected to an ion bombardment treatment, and thus strain can be introduced. Since it is difficult to confirm the strained area under an optical microscope or a scanning electron microscope (SEM), in the present embodiment, the strained area was observed from a bright field image obtained by a transmission electron microscope (TEM). FIG. 1 and FIG. 2 show cross-sectional views of the covering member of the present embodiment. As shown in FIG. 1 and FIG. 2, a dark part observed between a metal layer 1 and a layer B 2 is a strained area 3. Here, in addition to the TEM, it is also possible to observe the strained area in the covering member of the present embodiment using a laser Raman spectroscopic method or an X-ray diffraction method.

The covering member of the present embodiment has a layer B selected from among a nitride, a carbonitride, an oxynitride, and an oxycarbonitride of Cr or CrM (M is one or two or more selected from among Group 4 metals, Group 5 metals, and Group 6 metals on the periodic table, Al, Si, and B) above the metal layer. The layer B may have a single-layer structure depending on the purpose or may have a multi-layer structure (including an alternating laminated structure) including two or more layers having different components in the above component range. For example, when it is desired to further improve the hardness or suppress the progress of cracking to further improve durability, it is preferable to have an alternating laminated structure. In the case of the single-layer structure, as in the layer A, when a total content of metal components contained in the layer B is set as 100 atom %, it is more preferable to select a nitride (Cr-based nitride) containing 25 atom % or more of Cr. It is preferable to select the alternating laminated structure because, when an alternating laminated film containing a Cr-based nitride is applied, a superior effect of guiding the corrosion path in a direction across a film growth direction from the film growth direction is easily obtained. The thickness of the layer B is preferably set to 4 to 20 μm. More preferably, the lower limit of the thickness of the layer B is 5 μm, more preferably, the thickness of the layer B is 6 μm, and more preferably, the upper limit of the thickness of the layer B can be set to 15 μm. When the layer B has an alternating laminated structure in which a layer b1 and a layer b2 are alternately laminated in multiple layers, the thickness of each of the layer b1 and the layer b2 is preferably 5 nm or more and 100 nm or less. In addition, when the layer B has an alternating laminated structure in which a layer b1 and a layer b2 are alternately laminated in multiple layers, an upper layer which is thicker than the film thickness of each of two layers that are alternately laminated and is selected from among a nitride, a carbonitride, an oxynitride, and an oxycarbonitride of Cr or CrM (M is one or two or more selected from among Group 4 metals, Group 5 metals, and Group 6 metals on the periodic table, Al, Si, and B) may be applied to the alternating laminated structure. Here, when the upper layer is provided, the alternating laminated structure and the upper layer are combined to form the layer B.

In addition, in the covering member of the present embodiment, a second metal layer containing Cr, Ti, or W may be additionally provided on the layer B. In this case, the second metal layer may be composed of atoms of the same metal as the metal layer formed between the layer A and the layer B or may be composed of atoms of a different metal. When the second metal layer is provided, in addition to a surface defect preventing effect, of an effect of improving initial conformability with a counterpart component by the soft metal layer can be expected to be exhibited. The thickness of the second metal layer is preferably set to 0.1 to 3.0 μm. In addition, since the second metal layer can be processed in the same furnace and can improve work efficiency, it is preferably composed of atoms of the same metal as the metal layer formed between the layer A and the layer B.

Next, the manufacturing method of the present embodiment will be described.

(First Coating Step)

In the manufacturing method of the present embodiment, first, a base material is coated with a layer A selected from among a nitride, a carbonitride, an oxynitride, and an oxycarbonitride of Cr or CrM (M is one or two or more selected from among Group 4 metals, Group 5 metals, and Group 6 metals on the periodic table, Al, Si, and B). It is preferable to select a Cr-based nitride film having excellent corrosion resistance. Regarding a coating means of the layer A, a physical vapor deposition method such as an arc ion plating method, a sputtering method, or a hollow cathode method which can improve film adhesion can be applied. In the present embodiment, the arc ion plating method is applied. The bias voltage during coating is preferably −150 to −40 V. More preferably, the lower limit of the bias voltage is −120 V, and more preferably, the upper limit of the bias voltage is −60 V. In addition, an arc current is preferably 60 to 150 A. More preferably, the lower limit of the arc current is 80 A, and more preferably, the upper limit of the arc current is 100 A.

(Polishing Step)

In the present embodiment, after the first coating step, a polishing step of polishing the surface of the layer A may be introduced. Thereby, since coarse droplets and particles on the surface of the layer A can be removed, it is possible to suppress the occurrence of pitting corrosion due to surface irregularities and improve corrosion resistance of the entire film. In the polishing means, a polishing cloth holding a polishing material such as a diamond paste, shot blasting, an ion etching treatment, or the like can be applied. Preferably, an ion etching treatment which can be performed in the same furnace as that of a film forming device to be described below is applied. When the ion etching treatment is applied in the polishing step, ion etching is performed under preferable conditions in which Ar gas is ionized in a chamber and the bias voltage is −600 to −200 V. More preferably, the lower limit of the bias voltage is −450 V, and more preferably, the upper limit of the bias voltage is −300 V. Here, in the present embodiment, a step in which ions (or radicals) are caused to collide with a base material or a film, and the surface is scraped off and washed and smoothed is referred to as "ion etching," and a step in which ions are caused to collide with the metal layer and strain is imparted to the surface of the metal layer is referred to as "ion bombardment."

(Metal Layer Coating Step)

Next, a metal layer containing Cr, Ti, or W having an effect of preventing growth of a defect structure is coated to the layer A. Regarding an application method for the metal layer, an existing physical vapor deposition method can be applied, but a film forming method used for the layer A is preferably applied because film formation can be performed in the same furnace to improve work efficiency. The metal layer is preferably coated at a bias voltage that is set to be within a range of −110 V to −60 V. More preferably, the lower limit of the bias voltage is −100 V. When the bias voltage is adjusted to be within the above range, there are advantages that adhesion with respect to the metal layer is improved and the structure of the metal layer is refined. In the first coating step, it is preferable to form a film while causing a small amount of Ar to flow. In this case, in order to stabilize discharging, the pressure of Ar gas can be set to 1 to 2 Pa. More preferably, the lower limit is 1.5 Pa, and more preferably, the upper limit is 1.8 Pa.

(Metal Layer Modifying Step)

The manufacturing method of the present embodiment includes a metal layer modifying step in which strain is introduced into a surface layer of the metal layer after the metal layer is coated. According to the metal layer modifying step, a strained area that can suppress progress of pitting corrosion from the layer B and maintain corrosion resistance for a long time can be formed on the surface layer of the metal layer. In order to form the strained area, it is preferable to perform bombardment with metal ions or Ar ions. More preferably, metal ion bombardment is performed. This is because metal ions have a larger mass than Ar ions and thus tend to impart strain efficiently when they collide with the surface. In addition, during the metal ion bombardment, the temperature of the surface tends to be higher than that in gas bombardment, and as a result, a strained area due to thermal strain after cooling tends to be easily formed. Here, in the present embodiment, when the metal ion bombardment is applied, metal ions preferably include a metal used in the metal layer coating step. Thereby, since the strained area can be formed by simply changing the bias voltage without taking out the member from the furnace, the productivity is excellent. When the metal ion bombardment is performed, the bias voltage is preferably adjusted to −120 V or less. Although the lower limit is not particularly limited, it is preferably adjusted to −800 V or more in order to obtain a metal layer having a desired film thickness more stably. More preferably, the bias voltage is −250 V to −150 V. When the bias voltage is adjusted to this range, it is possible to stably form the above strained area. In addition, the ion bombardment time can be set to 5 to 30 min when metal ions are coated and can be set to 5 to 20 min when Ar ions are coated. Here, when Ar ion bombardment is performed, the bias voltage may be appropriately adjusted to a value at which the metal layer is not scraped off and strain is introduced.

(Second Coating Step)

The manufacturing method of the present embodiment includes a second coating step in which a layer B selected from among a nitride, a carbonitride, an oxynitride, and an oxycarbonitride of Cr or CrM (M is one or two or more selected from among Group 4 metals, Group 5 metals, and Group 6 metals on the periodic table, Al, Si, and B) is coated on the metal layer subjected to the metal layer modifying step. Regarding coating means and coating conditions, the same conditions as in the first coating step can be applied, but a single-layer film or a multi-layer film including two or more layers having different components (including an alternating laminated film) can be appropriately selected and applied depending on desired applications. For example, when an alternating laminated film containing CrN and AlCrSiN is coated, it can be produced by a manufacturing method in which a Cr target and an AlCrSi target are simultaneously discharged.

In the manufacturing method of the present embodiment, a second metal layer coating step in which a metal layer containing Cr, Ti, or W is additionally coated on the coated layer B can be performed. Conditions for coating the second metal layer may be set to the same as the above conditions in which the metal layer is formed on the layer A.

EXAMPLES

First, a base material (YPT42 (commercially available from Hitachi Metals, Ltd.)) was prepared. An arc ion plating device was used as a coating device, Cr and TiW were prepared as targets for layer A formation and metal ion bombardment, and AlCrSi, CrSi, and AlCr were prepared as targets for layer B formation. Before the base material was coated with the layer A, the surface of the base material was polished so that it had an average roughness Ra of 0.05 µm and an Rz of 0.1 µm, and was subjected to degreasing washing, and fixed to a base material holder. Then, the base material was heated to about 500° C. by a heater for heating installed in a chamber and left for 50 min. Next, Ar gas was introduced, a bias voltage of −200 V was applied to the base material, and a plasma cleaning treatment (Ar ion etching) was performed for 20 min. Next, the bias voltage applied to the base material was changed to −800 V, and Cr ion bombardment was performed for about 20 min.

Then, film forming conditions, ion etching conditions, and the like were adjusted to produce samples of examples of the present invention and comparative examples.

Example 1

<Sample No. 1>

Under conditions in which the temperature of the base material was 500° C. and the pressure of a reaction gas was 4.0 Pa, the bias voltage was set to −60 V, CrN for the layer A was coated to a thickness of about 6 µm (first coating step), Ar etching was then performed at a bias voltage of −300 V, the bias voltage was set to −100 V, and Cr for the metal layer was coated to a thickness of 1 µm (metal layer coating step). Then, the bias voltage was changed to −120 V, metal ion bombardment using Cr ions was performed on the surface of the metal layer for about 10 min, and a strained area was formed (metal layer modifying step). Then, under a condition in which the bias voltage was −80 V, an AlCrSiN/CrN alternating laminated film (thickness of each layer: 20 to 30 nm) was coated as the layer B to a thickness of about 6 µm (second coating step), and CrN for the upper layer of the layer B was coated to a thickness of 3 µm.

<Sample No. 2>

The first coating step to the metal layer modifying step were performed under the same conditions as in Sample No. 1. Then, under a condition in which the bias voltage was −80 V, an AlCrSiN/CrN alternating laminated film (thickness of each layer: 20 to 30 nm) was coated as the layer B to a thickness of about 3 µm, and CrN for the upper layer was coated to a thickness of 3 µm.

<Sample No. 3>

The first coating step to the metal layer coating step were performed under the same conditions as in Sample No. 1. Then, the bias voltage was changed to −200 V, ion bombardment using Ar gas was performed on the surface of the metal layer under a condition in which the bias voltage was −200 V, and a strained area was formed. Next, under a condition in which the bias voltage was −80, an AlCrSiN/CrN alternating laminated film (thickness of each layer: 20 to 30 nm) was coated as the layer B to a thickness of about 3 µm, and CrN for the upper layer was coated to a thickness of 3 µm.

<Sample No. 4>

The layer A was coated under the same conditions as in Sample No. 1. After the layer A was coated, the sample was removed from the furnace once, the surface of the sample was polished using an AERO LAP device AERO LAP YT-300 (AERO LAP, registered trademark, commercially available from Yamashita Works Co., Ltd.) for about 5 min, and the surface of the layer A was adjusted so that it had an arithmetic average roughness Ra of 0.01 µm and a maximum height Rz of 2.00 µm or less. Then, the sample was returned to the furnace, the metal layer was coated under the same conditions as in Sample No. 1, ion bombardment using Ar gas was then performed on the surface of the metal layer under a condition in which the bias voltage was −200 V, and a strained area was formed. Then, under a condition in which the bias voltage was −80 V, an AlCrSiN/CrN alternating laminated film (thickness of each layer: 20 to 30 nm) was coated as the layer B to a thickness of about 3 µm, and CrN for the upper layer was coated to a thickness of 3 µm.

<Sample No. 5>

CrN for the layer A was coated to a thickness of about 4 µm and Ar etching was then performed at a bias voltage of −300 V. The same conditions as in Sample No. 2 were set in the subsequent metal layer coating step and thereafter.

<Sample No. 6>

A first step was performed under the same conditions as in Sample No. 1. Then, Ar etching was performed at a bias voltage of −300 V, the bias voltage was set to −100 V, and TiW for the metal layer was coated to a thickness of 1 µm (metal layer coating step). Then, the bias voltage was changed to −120 V, metal ion bombardment using Ti ions and W ions was performed on the surface of the metal layer for about 10 min, and a strained area was formed (metal layer modifying step). Then, under a condition in which the bias voltage was −80 V, an AlCrSiN/CrN alternating laminated film (thickness of each layer: 20 to 30 nm) was coated as the layer B to a thickness of about 6 µm (second coating step), and CrN for the upper layer of the layer B was coated to a thickness of 3 µm. The same conditions as in Sample No. 2 were set in the subsequent metal layer coating step and thereafter.

<Sample No. 7>

Under conditions in which the temperature of the base material was 500° C. and the pressure of a reaction gas was 4.0 Pa, the bias voltage was set to −80 V, AlCrN for the layer A was coated to a thickness of about 6 µm (first coating step), Ar etching was then performed at a bias voltage of −300 V, the bias voltage was set to −100 V, and Cr for the metal layer was coated to a thickness of 1 µm (metal layer coating step). Then, the bias voltage was changed to −120 V, metal ion bombardment using Cr ions was performed on the surface of the metal layer for about 10 min, and a strained area was formed (metal layer modifying step). Then, under a condition in which the bias voltage was −100 V, a CrSiBN/AlCrN alternating laminated film (thickness of each layer: 20 to 30 nm) was coated as the layer B to a thickness of about 6 µm (second coating step), and CrSiBN for the upper layer of the layer B was coated to a thickness of 3 µm. The same conditions as in Sample No. 2 were set in the subsequent metal layer coating step and thereafter.

<Sample No. 11>

The layer A was coated under the same conditions as in Sample No. 1. Then, the bias voltage during the metal layer coating step and during the metal layer modifying step was set to be higher than that in the condition of Sample No. 1, and adjusted so that no strained area was formed, and thereby a sample was produced. The other conditions were set to be the same as in Sample No. 2.

<Sample No. 12>

The layer A was coated under the same conditions as in Sample No. 1. Then, the bias voltage during the metal layer coating step was set to be the same value as in Sample No. 1, the bias voltage during the metal layer modifying step was set to be higher than that in the condition of Sample No. 1 and adjusted so that no strained area was formed, and thereby a sample was produced. The other conditions were set to be the same as in Sample No. 2.

<Sample No. 13>

The layer A was coated under the same conditions as in Sample No. 1. Then, Ar etching was performed at a bias voltage of −300 V. Then, without performing the metal layer coating step and the metal layer modifying step, the layer B was coated on the layer A under the same conditions as in Sample No. 2, and CrN for the upper layer was coated to a thickness of 3 μm.

The produced samples were subjected to a corrosion resistance evaluation test. A test in which a corrosion gas such as a halogen gas or a sulfide gas generated during actual injection molding was simulated, and the sample was immersed in a 10% sulfuric acid aqueous solution for 10 hours was performed. The temperature of the aqueous solution was set to 50° C., and according to JIS-G-0591-2007, parts of the test piece other than the coated surface were masked, and pitting corrosion appearing on the surface after immersion was observed. The state of pitting corrosion on the test surface (φ18 mm) was evaluated using a stereomicroscope picture (magnification: ×10) obtained by a stereomicroscope (commercially available from Nikon Corporation). In evaluation of corrosion resistance, in the stereomicroscope picture, when there was a pitting corrosion having a size of 0.2 mm or more and less than 0.8 mm, it was evaluated as Δ, when there was a spot-like corrosion having a size of less than 0.2 mm, it was evaluated as O, and when there was no pitting corrosion or spot-like corrosion, it was evaluated as ◎. The number of pitting corrosions having each size was measured. Evaluation results are shown in Table 1.

TABLE 1

| Sample No. | Composition of layer A | Film thickness of layer A (μm) | Polishing step | Composition of metal layer | Bias voltage (V) during metal layer coating step | Metal layer modifying step |
|---|---|---|---|---|---|---|
| 1 | CrN | 6 | Ar etching | Cr | −100 | Cr bombardment |
| 2 | | 6 | Ar etching | Cr | −100 | Cr bombardment |
| 3 | | 6 | Ar etching | Cr | −100 | Ar bombardment |
| 4 | | 6 | AERO LAP | Cr | −100 | Ar bombardment |
| 5 | | 4 | Ar etching | Cr | −100 | Cr bombardment |
| 6 | | 6 | Ar etching | TiW | −100 | Ti, W bombardment |
| 7 | AlCrN | 6 | Ar etching | Cr | −100 | Cr bombardment |
| 11 | CrN | 6 | Ar etching | Cr | −40 | Cr bombardment |
| 12 | | 6 | Ar etching | Cr | −100 | Cr bombardment |
| 13 | | 6 | Ar etching | None | None | None |

| Sample No. | Bias voltage (V) during metal layer modifying step | Composition of layer B | Film thickness of layer B (μm) | Composition of upper layer | Film thickness of upper layer (μm) | Test result |
|---|---|---|---|---|---|---|
| 1 | −120 | AlCrSiN/CrN | 6 | CrN | 3 | ◎ |
| 2 | −120 | | 3 | | 3 | ◎ |
| 3 | −200 | | 3 | | 3 | O |
| 4 | −200 | | 3 | | 3 | O |
| 5 | −120 | | 3 | | 3 | O |
| 6 | −120 | | 6 | | 3 | ◎ |
| 7 | −120 | CrSiBN/AlCrN | 6 | CrSiBN | 3 | ◎ |
| 11 | −60 | AlCrSiN/CrN | 3 | CrN | 3 | Δ |
| 12 | −60 | | 3 | | 3 | Δ |
| 13 | None | | 3 | | 3 | Δ |

Figure 3:
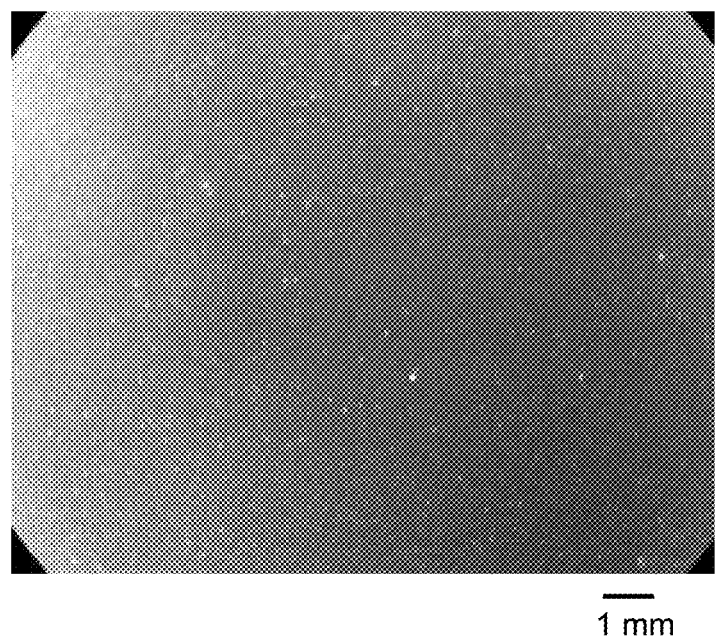
FIG. 3 is a picture of a surface of a sample that is an example of the present invention after a pitting corrosion test.
Figure 4:
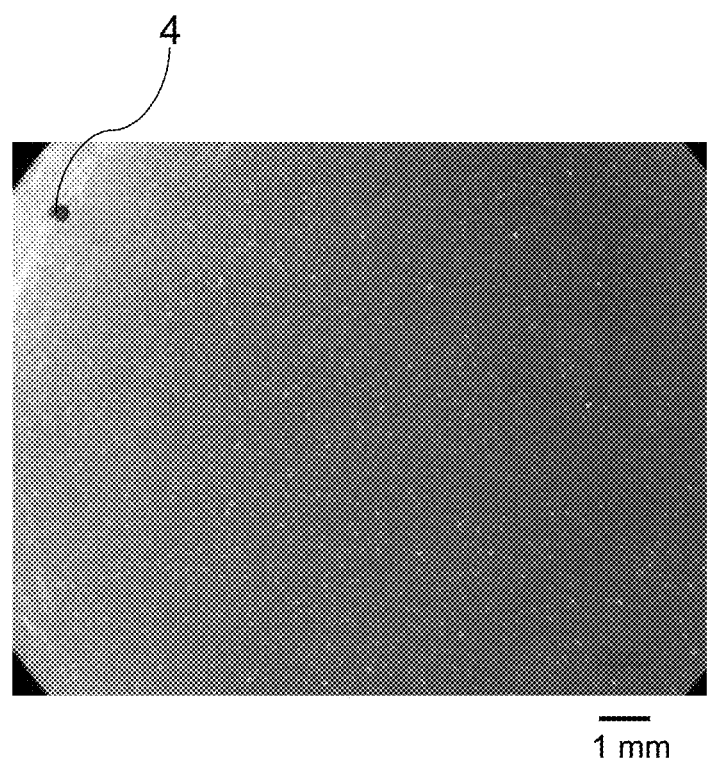
FIG. 4 is a picture of a surface of a sample that is a comparative example after a pitting corrosion test.

As shown in the results in Table 1, Samples Nos. 1 to 7 that are examples of the present invention had favorable values because no large pitting corrosion having a size of 0.2 mm or more was found. In particular, it was confirmed that no spot-like corrosion was observed in Samples Nos. 1, 2, 6, and 7, and more favorable corrosion resistance than that of samples 3 to 5 as examples of the present invention was exhibited. For example, FIG. 3 shows a picture of the surface of the sample 30 h after the corrosion resistance test for Sample No. 1. It was confirmed that slight corrosion was observed after 40 h in Sample No. 2, but no corrosion was observed even after 50 h in Sample No. 1, and very good corrosion resistance was exhibited. In addition, although not shown in the drawing, it was confirmed that, as in Sample No. 1, no corrosion was observed in Sample No. 6 and Sample No. 7 even after 50 h. On the other hand, it was confirmed that, in both of samples of Samples No. 11 and No. 13 that are comparative examples, a relatively large pitting corrosion occurred within about 10 h after the test started. For example, FIG. 4 shows a picture of the surface of the sample 10 h after the corrosion resistance test for Sample No. 13 that is a comparative example started. Based on FIG. 4, it was confirmed that a pitting corrosion 4 occurred in Sample No. 13. In addition, in Sample No. 12, a spot-like corrosion was observed on the surface of the sample 10 h after the test started, and a pitting corrosion occurred after 20 h. Based on the results, it was determined that the examples of the present invention had improved corrosion resistance due to formation of the strained area.

Next, Sample No. 1 exhibiting favorable results was cut in the film thickness direction, and the cross section was checked using a TEM (commercially available from JEOL, measurement conditions: acceleration voltage of 200 kV). The results are shown in FIG. 1 and FIG. 2. FIG. 1 is a TEM image of the cross section of the sample showing the vicinity of the boundary between the metal layer and the layer B. FIG. 2 is a TEM image of an enlarged area A in FIG. 1 for checking the strained area. As shown in FIG. 1 and FIG. 2, it was confirmed that, on the side of the upper surface of the metal layer (the side of the layer B) of Sample No. 1 that is an example of the present invention, a dark strained area was formed between a Cr layer 1 as the metal layer and an AlCrSiN/CrN multi-layer film 2 as the layer B.

Example 2

Next, the melting resistance was evaluated. DAC (commercially available from Hitachi Metals, Ltd., hardness: about 45 HRC) was prepared as the base material. An arc ion plating device was used as a coating device, Cr was prepared as a target for film formation and metal ion bombardment and AlCrSi was prepared as a target for a hard component. Before the layer A was coated on the base material, the surface of the base material was polished so that it had an average roughness of Ra 0.05 μm and an Rz of 0.1 μm, and was subjected to degreasing washing, and fixed to a base material holder. Then, the base material was heated to about 500° C. by a heater for heating installed in a chamber and left for 50 min. Next, Ar gas was introduced, a bias voltage of −200 V was applied to the base material, and a plasma cleaning treatment (Ar ion etching) was performed for 20 min. Next, the bias voltage applied to the base material was changed to −800 V, and Cr bombardment was performed for about 20 min.

Then, film forming conditions, ion etching conditions, and the like were adjusted to produce samples of examples of the present invention and comparative examples.

<Sample No. 8>

Under conditions in which the temperature of the base material was 500° C. and the pressure of a reaction gas was 4.0 Pa, CrN for the layer A was coated to a thickness of about 6 μm (first coating step), Ar etching was then performed at a bias voltage of −300 V, the bias voltage was set to −100 V, and Cr for the metal layer was coated to a thickness of 1 μm (metal layer coating step). Then, the bias voltage was changed to −120 V, metal ion bombardment using Cr ions was performed on the surface of the metal layer for about 10 min, and a strained area was formed (metal layer modifying step). Then, under a condition in which the bias voltage was −80 V, an AlCrSiN/CrN alternating laminated film (thickness of each layer: 20 to 30 nm) was coated as the layer B to a thickness of about 6 μm (second coating step), CrN for the upper layer of the layer B was coated to a thickness of 3 μm, and Sample No. 8 as the present invention was produced.

<Sample No. 14>

Under conditions in which the temperature of the base material was 500° C. and the pressure of the reaction gas was 4.0 Pa, CrN was coated to a thickness of about 3 μm at a bias voltage of −50 V, and then under a condition in which the bias voltage was −80 V, an AlCrSiN/CrN alternating laminated film (thickness of each layer: 20 to 30 nm) was coated to a thickness of about 4 μm, and additionally, CrN for the upper layer was coated to a thickness of 3 μm, and Sample No. 14 was produced as a comparative example.

<Sample No. 15>

Under conditions in which the temperature of the base material was 500° C. and the pressure of the reaction gas was 4.0 Pa, and under a condition in which the bias voltage was −80 V, an AlCrSiN film was coated to a thickness of about 3 μm, and Sample No. 15 was produced as a comparative example.

The produced Samples No. 8, No. 14, and No. 15 were subjected to a melting resistance evaluation test. The example of the present invention and comparative examples were immersed in a molten aluminum metal at 700° C. for 30 hours, and it was checked whether melting occurred under an optical microscope. In addition, the masses before and after the test were measured to determine a melting rate (%). FIG. 5 to FIG. 10 show the results of the melting test for the example of the present invention and comparative examples.

Figure 5:
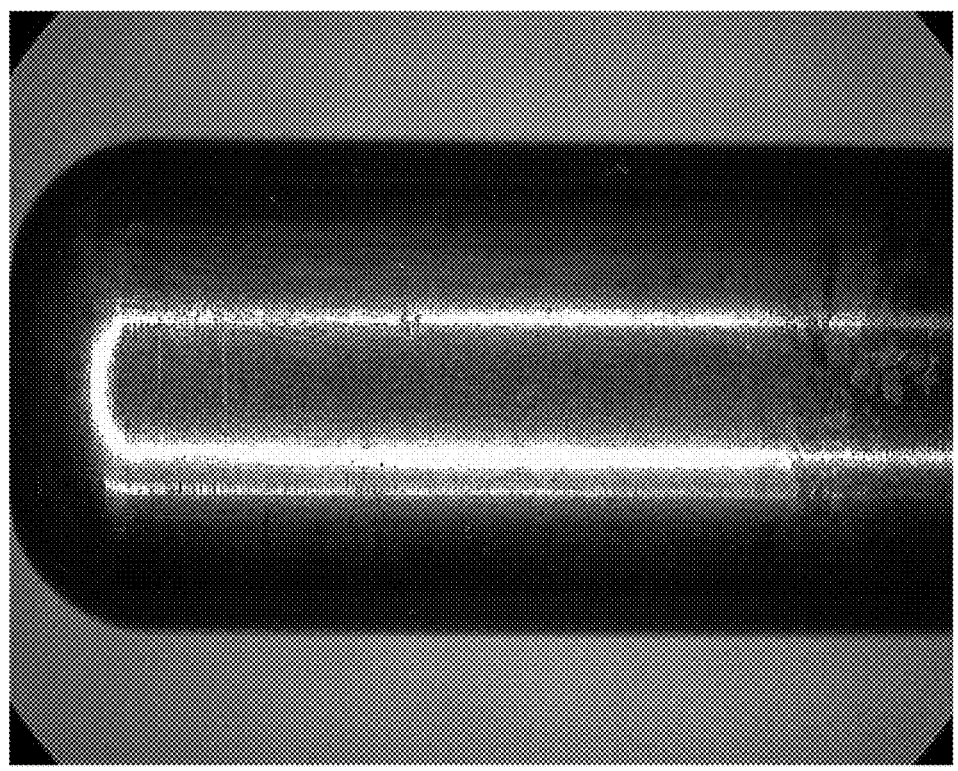
FIG. 5 is a picture of a side of a sample that is an example of the present invention after a melting test.
Figure 6:
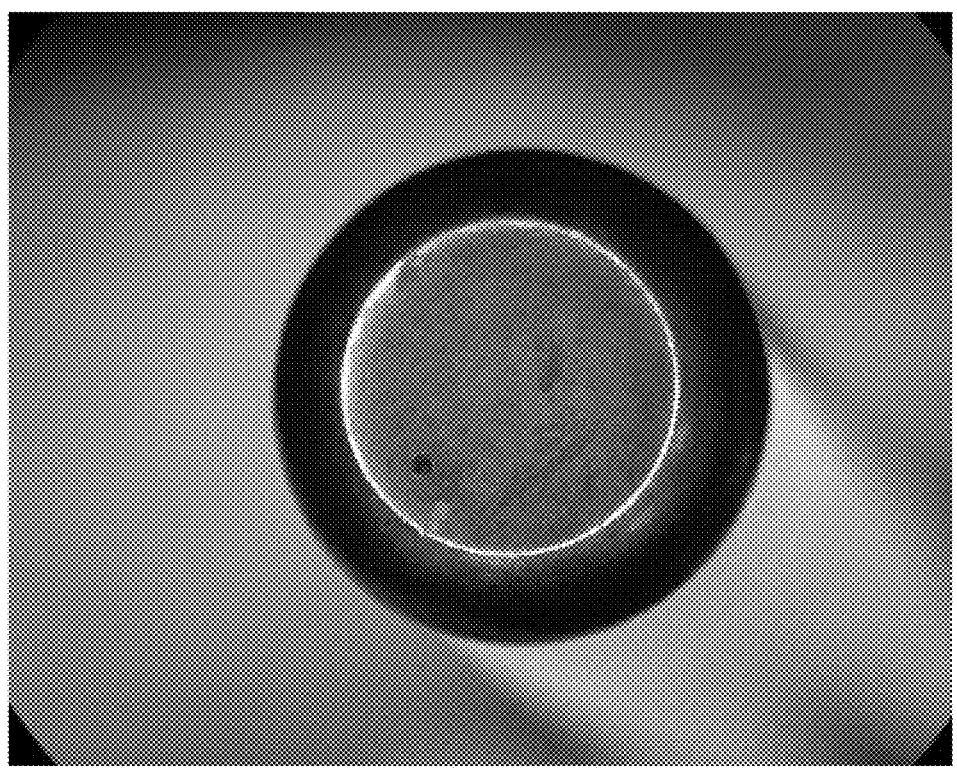
FIG. 6 is a picture of a bottom of a sample that is an example of the present invention after a melting test.
Figure 7:
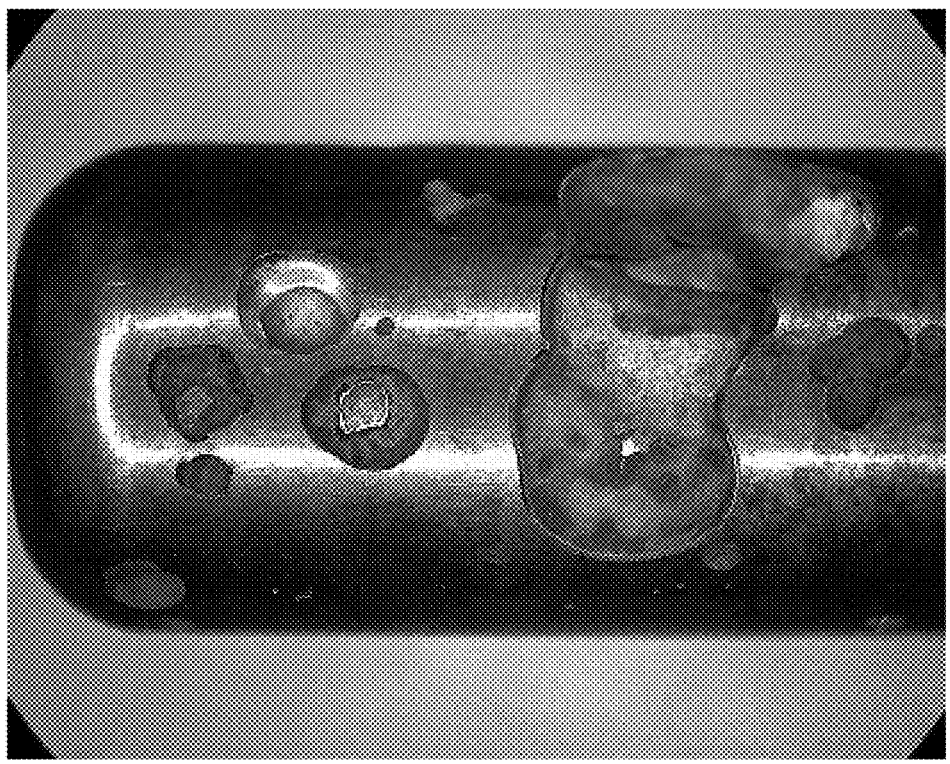
FIG. 7 is a picture of a side of a sample that is a comparative example after a melting test.
Figure 8:
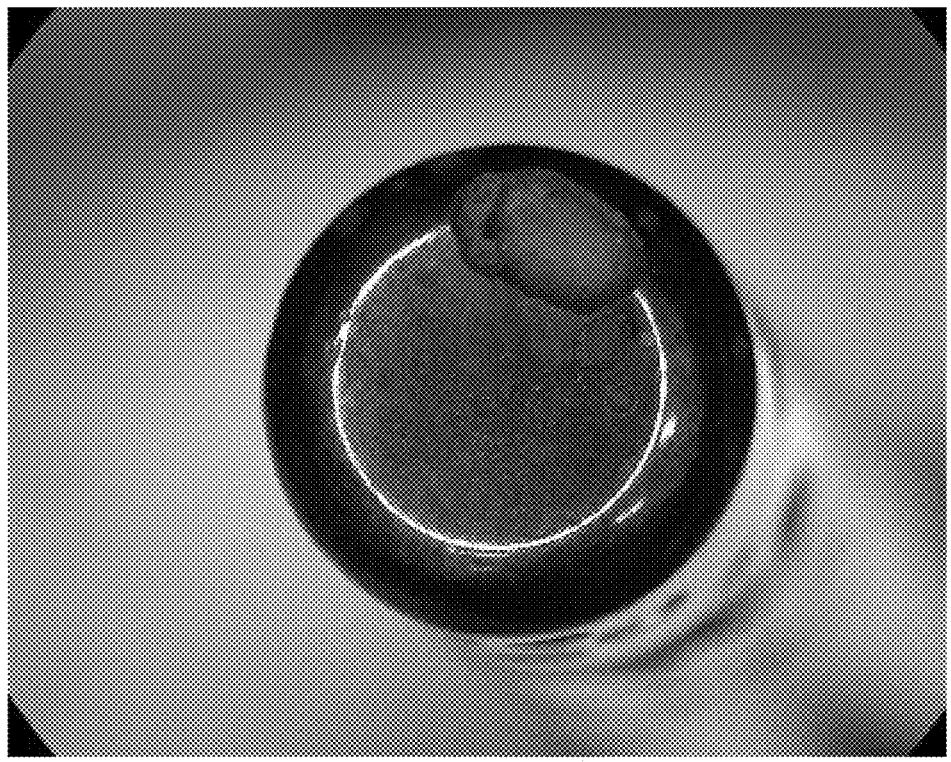
FIG. 8 is a picture of a bottom of a sample that is a comparative example after a melting test.
Figure 9:
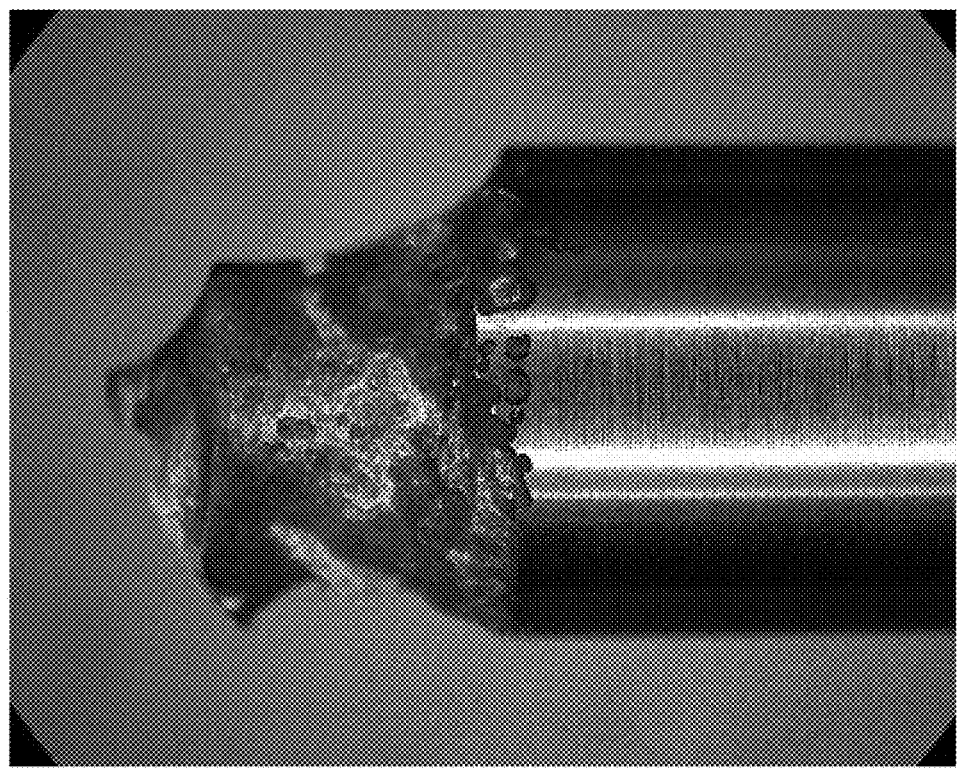
FIG. 9 is a picture of a side of a sample that is another comparative example after a melting test.
Figure 10:
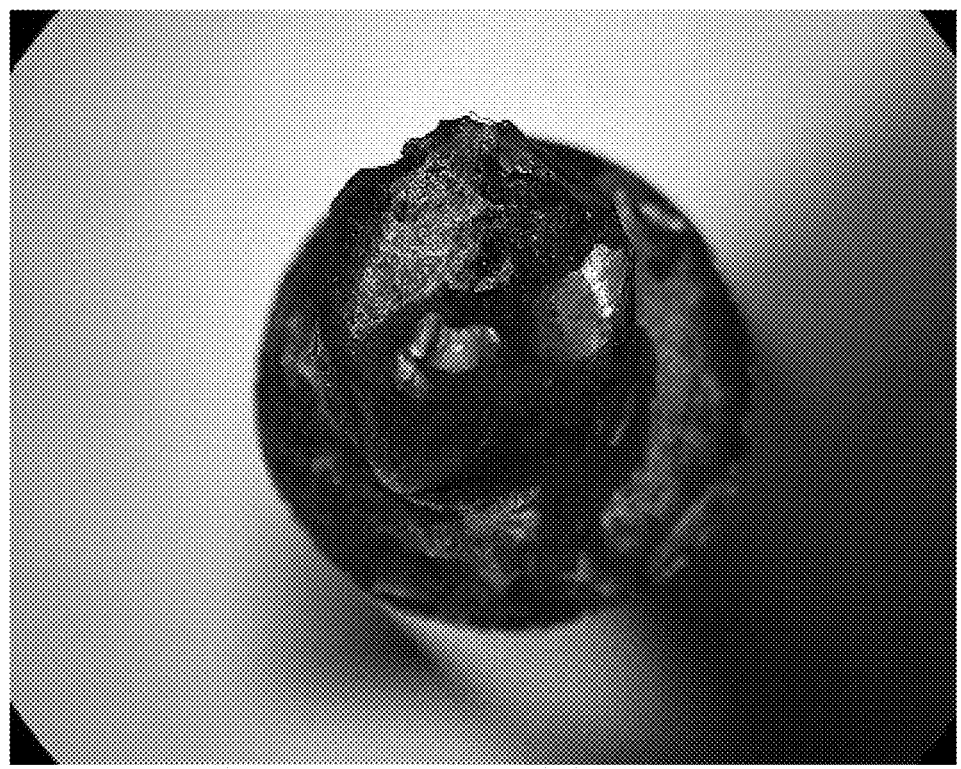
FIG. 10 is a picture of a bottom of a sample that is another comparative example after a melting test.

As shown in FIG. 5 and FIG. 6, in Sample No. 8 that is the example of the present invention, even after 30 hours, no melting was observed, and the melting rate exhibited a very good result at 0.0%. On the other hand, as shown in FIG. 7 and FIG. 8, in Sample No. 14 that is a comparative example, melting occurred in the sample. It was confirmed that the melting rate was 1.3% and a melting resistance lower than that of Sample No. 8 was exhibited. In addition, in Sample No. 15 that is a comparative example, a large amount of melting as shown in FIG. 9 and FIG. 10 occurred at a time of 6 hours after the test started, and therefore the test was stopped. In this case, the melting rate was 23%. The reason for the rapid progress of melting in Sample No. 15 was speculated to be that the film thickness was thin, the structure of the film was a single layer, and thus penetration defects were likely to occur.

REFERENCE SIGNS LIST

1 Metal layer
2 Layer B
3 Strained area
4 Pitting corrosion

The invention claimed is:
1. A covering member having a hard film on a surface of a base material,
  wherein the hard film includes a layer A selected from among a nitride, a carbonitride, an oxynitride, and an oxycarbonitride of Cr or CrM (M is one or two or more selected from among Group 4 metals, Group 5 metals, and Group 6 metals on the periodic table, Al, Si, and B),
  a metal layer which is formed on an outer surface side of the layer A and contains Cr, Ti, or W, and
  a layer B which is formed on the outer surface side of the metal layer and is selected from among a nitride, a carbonitride, an oxynitride, and an oxycarbonitride of Cr or CrM (M is one or two or more selected from among Group 4 metals, Group 5 metals, and Group 6 metals on the periodic table, Al, Si, and B), wherein the metal layer is between the layer A and the layer B, and wherein strain is introduced into the outer surface side of the metal layer to form a strain area, the strain area is located at the outer surface side adjacent to the layer B.

2. The covering member according to claim 1, wherein a second metal layer containing Cr, Ti, or W is provided on the outer surface side of the layer B.

3. The covering member according to claim 1, wherein the thickness of at least one of the layer A and the layer B is 4 to 20 μm.

4. The covering member according to claim 3, wherein the thickness of at least one of the layer A and the layer B is 6 μm or more.

5. A method for manufacturing a covering member having a hard film on a surface of a base material, comprising:
   a first coating step in which a base material is coated with a layer A selected from among a nitride, a carbonitride, an oxynitride, and an oxycarbonitride of Cr or CrM (M is one or two or more selected from among Group 4 metals, Group 5 metals, and Group 6 metals on the periodic table, Al, Si, and B);
   a metal layer coating step in which a metal layer containing Cr, Ti, or W is coated after the layer A is coated;
   a metal layer modifying step in which strain is introduced into a surface layer of the metal layer after the metal layer is coated; and
   a second coating step in which a layer B selected from among a nitride, a carbonitride, an oxynitride, and an oxycarbonitride of Cr or CrM (M is one or two or more selected from among Group 4 metals, Group 5 metals, and Group 6 metals on the periodic table, Al, Si, and B) is coated after the metal layer modifying step.

6. The method for manufacturing a covering member according to claim 5, wherein the metal layer modifying step is metal ion bombardment using Cr ions or Ti ions.

7. The method for manufacturing a covering member according to claim 5, wherein a polishing step of polishing a surface of the layer A is performed between the first coating step and the metal layer coating step.

8. The method for manufacturing a covering member according to claim 5, wherein a second metal layer coating step in which a second metal layer containing Cr, Ti or W is coated is provided after the second coating step.

* * * * *